(12) United States Patent
Wang et al.

(10) Patent No.: US 12,232,330 B2
(45) Date of Patent: Feb. 18, 2025

(54) METHOD FOR MANUFACTURING SEMICONDUCTOR STRUCTURE, SEMICONDUCTOR STRUCTURE AND SEMICONDUCTOR MEMORY

(71) Applicants: CHANGXIN MEMORY TECHNOLOGIES, INC., Hefei (CN); BEIJING SUPERSTRING ACADEMY OF MEMORY TECHNOLOGY, BeiJing (CN)

(72) Inventors: Xiaoguang Wang, Hefei (CN); Huihui Li, Hefei (CN); Dinggui Zeng, Hefei (CN); Jiefang Deng, Hefei (CN); Kanyu Cao, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 392 days.

(21) Appl. No.: 17/805,004

(22) Filed: Jun. 1, 2022

(65) Prior Publication Data
US 2023/0061322 A1 Mar. 2, 2023

Related U.S. Application Data

(63) Continuation of application No. PCT/CN2022/077704, filed on Feb. 24, 2022.

(30) Foreign Application Priority Data

Aug. 31, 2021 (CN) .......................... 202111009872.0

(51) Int. Cl.
*H10B 61/00* (2023.01)
*H10N 50/01* (2023.01)

(52) U.S. Cl.
CPC .............. *H10B 61/00* (2023.02); *H10N 50/01* (2023.02)

(58) Field of Classification Search
CPC ........ H10B 61/00; H10N 50/01; H10N 50/10; H10N 50/80; H10N 50/85; G11C 11/161
See application file for complete search history.

(56) References Cited

U.S. PATENT DOCUMENTS

| 11,043,632 B2 | 6/2021 | Sundar |
| 2011/0076784 A1 | 3/2011 | Druist |

(Continued)

FOREIGN PATENT DOCUMENTS

| CN | 106104790 A | 11/2016 |
| CN | 108931882 A | 12/2018 |

(Continued)

OTHER PUBLICATIONS

Chung S. W., et al, "4Gbit density STT-MRAM using perpendicular MTJ realized with compact cell structure", [IEEE 2016 IEEE International Electron Devices Meeting (IEDM)—San Francisco, CA, USA (Dec. 3, 2016-Dec. 2016)], doi: 10.1109/IEDM.2016. 7838490, p. 659-662.

(Continued)

*Primary Examiner* — Brook Kebede
(74) *Attorney, Agent, or Firm* — Syncoda LLC; Feng Ma

(57) ABSTRACT

A method for manufacturing a semiconductor structure includes the following: providing a substrate; forming an MTJ structure and a first mask structure in sequence on the substrate; performing a patterning process on the first mask structure to form a first pattern extending in a first direction; transferring the first pattern to the MTJ structure; forming a second mask structure on the MTJ structure; performing a patterning process on the second mask structure to form a second pattern extending in a second direction, the first (Continued)

direction intersecting the second direction and being not perpendicular to the second direction; and performing a patterning process on the MTJ structure by utilizing the second pattern to form a cellular MTJ array, the first pattern and the second pattern together forming a cellular pattern.

20 Claims, 36 Drawing Sheets

(56) References Cited

U.S. PATENT DOCUMENTS

| | | | |
|---|---|---|---|
| 2018/0341172 A1 | 11/2018 | Kim et al. | |
| 2019/0066746 A1* | 2/2019 | Li | G11C 11/161 |
| 2019/0067566 A1* | 2/2019 | Nagel | H10N 50/80 |
| 2020/0066730 A1 | 2/2020 | Guo et al. | |
| 2020/0119259 A1* | 4/2020 | Ahn | H10N 50/01 |
| 2020/0185389 A1 | 6/2020 | Guo et al. | |
| 2020/0209733 A1 | 7/2020 | Kim et al. | |
| 2021/0083180 A1 | 3/2021 | Sundar et al. | |

FOREIGN PATENT DOCUMENTS

| | | |
|---|---|---|
| CN | 112309986 A | 2/2021 |
| CN | 112514070 A | 3/2021 |
| CN | 112563409 A | 3/2021 |

OTHER PUBLICATIONS

Rho, Kwangmyoung, et al, "A 4Gb LPDDR2 STT-MRAM with compact 9F2 1T1MTJ cell and hierarchical bitline architecture", [IEEE 2017 IEEE International Solid-State Circuits Conference—(ISSCC)—San Francisco, CA, USA (Feb. 5-Feb. 9, 2017)], doi: 10.1109/ISSCC.2017.7870428, p. 396-397.

* cited by examiner

METHOD FOR MANUFACTURING SEMICONDUCTOR STRUCTURE, SEMICONDUCTOR STRUCTURE AND SEMICONDUCTOR MEMORY

CROSS-REFERENCE TO RELATED APPLICATIONS

This application is a continuation application of International Application No. PCT/CN2022/077704 filed on Feb. 24, 2022, which claims priority to Chinese Patent Application No. 202111009872.0 filed on Aug. 31, 2021. The disclosures of these applications are hereby incorporated by reference in their entirety.

BACKGROUND

Electronic memories include volatile memories and nonvolatile memories. The volatile memories may lose stored data in case of power failure, while the nonvolatile memories can retain data in case of power failure. Magnetoresistive random access memories (MRAMs) belong to a nonvolatile memory. Compared with existing nonvolatile memories (such as flash random access memories), MRAMs have faster storage and are more durable. Compared with existing volatile memories (such as dynamic random access memories (DRAMs) and static random access memories), MRAMs have lower power consumption.

MRAMs stores data through magnetic tunnel junctions (MTJs). However, MRAMs have much larger memory cells as compared with other types of memories, and thus have a low density, which limits the market application of MRAMs.

SUMMARY

Embodiments of the disclosure relate to the technical field of semiconductors, and particularly to a method for manufacturing a semiconductor structure, a semiconductor structure and a semiconductor memory.

According to a first aspect, embodiments of the disclosure provide a method for manufacturing a semiconductor structure, which includes the following operations.

A substrate is provided.

An MTJ structure and a first mask structure are formed in sequence on the substrate.

A patterning process is performed on the first mask structure to form a first pattern extending in a first direction.

The first pattern is transferred to the MTJ structure.

A second mask structure is formed on the MTJ structure.

A patterning process is performed on the second mask structure to form a second pattern extending in a second direction, the first direction intersecting the second direction, and the first direction being not perpendicular to the second direction.

A patterning process is performed on the MTJ structure by utilizing the second pattern to form a cellular MTJ array, in which the first pattern and the second pattern together form a cellular pattern.

According to a second aspect, embodiments of the disclosure provide a semiconductor structure. The semiconductor structure includes a substrate; and a cellular MTJ array formed on the substrate, in which the cellular MTJ array is arranged in a cellular pattern, which includes a first pattern extending in a first direction and a second pattern extending in a second direction, in which the first direction intersects the second direction, and is not perpendicular to the second direction.

According to a third aspect, embodiments of the disclosure provide a semiconductor memory, which includes the semiconductor structure as described in the second aspect.

DETAILED DESCRIPTION

Figure 1:
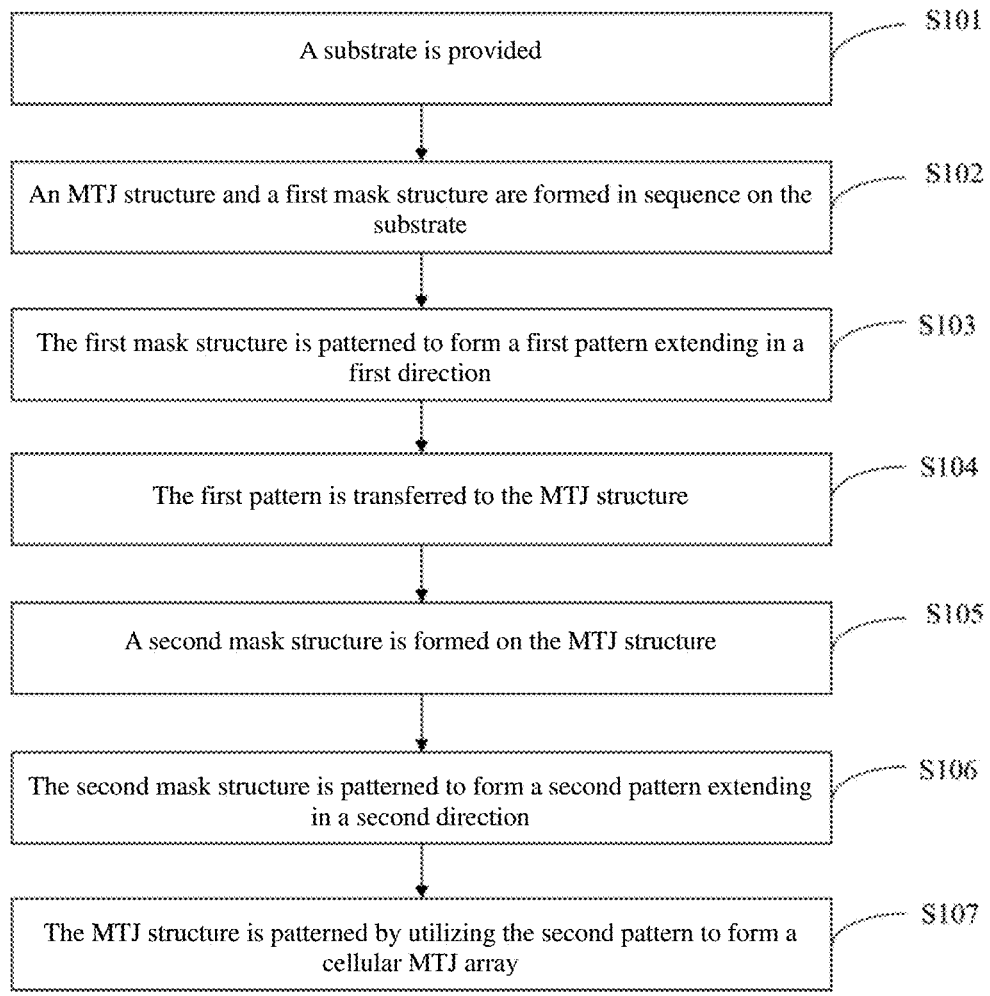
FIG. 1 is a schematic flowchart of a method for manufacturing a semiconductor structure according to an embodiment of the disclosure.

The technical solutions in the embodiments of the disclosure will be described clearly and completely below in combination with the drawings in the embodiments of the disclosure. It can be understood that specific embodiments described herein are only for explaining the related disclosure rather than limiting the disclosure. In addition, it is also to be noted that, for ease of description, only parts related to the related disclosure are shown in the drawings.

Unless otherwise defined, all technical and scientific terms used herein have the same meanings as commonly understood by those skilled in the art the disclosure belongs to. Terms used herein are only for a purpose of describing the embodiments of the disclosure and not intended to limit the disclosure.

"Some embodiments" involved in the following descriptions describes a subset of all possible embodiments. However, it can be understood that "some embodiments" may be the same or different subsets of all the possible embodiments, and may be combined with one another without conflicts.

It is to be pointed out that term "first/second/third" involved in the embodiments of the disclosure is only for distinguishing similar objects and does not represent a specific sequence of the objects. It can be understood that "first/second/third" may be interchanged according to specific sequences or orders if allowed such that the embodiments of the disclosure described herein may be implemented in sequences except those illustrated or described herein.

At present, MRAMs are mainly aimed at niche markets. Compared with DRAMs, the memory cells of MRAMs are much larger, which limits the application of MRAMs in mainstream markets, and therefore, MRAMs can only be used in a few fields.

In order to improve the memory density of MRAM, the memory cell thereof needs to be reduced. However, the improvement of the memory density of the MRAM meets great challenges at present mainly due to the patterning process of the MTJ array in the MRAM. Therefore, the embodiments of the disclosure are desired to provide a patterning solution capable of manufacturing a high-density MTJ array, to improve the memory density of the MRAM.

However, it is hard to achieve high-density etching of MTJs due to the shadow effect. For complex and challenging patterning of a high-density MTJ array, the embodiments of the disclosure provide a solution, of photo-etching with a high-density dot matrix pattern, in which a high-density cellular MTJ array is utilized, so that the memory density of a semiconductor memory is improved when the memory is formed, and it facilitates the extension of the application market of MRAMs. Moreover, the cellular pattern is highly symmetrical, which is advantageous to the patterning process when an MTJ layer is etched.

Each embodiment of the disclosure will be described below in combination with the drawings in detail.

In some embodiments of the disclosure, referring to FIG. 1, FIG. 1 is a schematic flowchart of a method for manufacturing a semiconductor structure according to an embodiment of the disclosure. As shown in FIG. 1, the method may include the following operations.

In S101, a substrate is provided.

It is to be noted that the substrate may be a silicon substrate or other suitable substrate materials such as silicon, germanium, a silicon-germanium compound and the like, such as a doped or undoped mono-crystalline silicon substrate, a polysilicon substrate or the like. No specific limit is made thereto in the embodiment of the disclosure.

In the embodiment of the disclosure, the substrate may preferably be a wafer that has been subjected to a front end of line (FEOL).

In S102, an MTJ structure and a first mask structure are formed sequentially on the substrate.

It is to be noted that, in the embodiment of the disclosure, the MTJ structure and the first mask structure are formed sequentially on the substrate. The first mask structure and the MTJ structure are subsequently processed in the following operations to finally obtain an MTJ array with a cellular structure.

Figure 2:
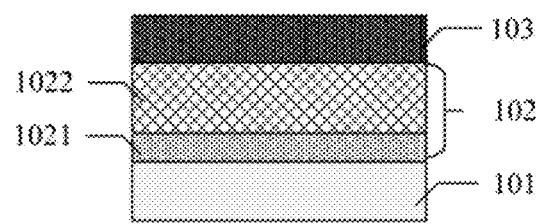
FIG. 2 is a schematic diagram of the structure obtained after a first mask structure is formed according to an embodiment of the disclosure.

Referring to FIG. 2, FIG. 2 is a schematic diagram of the structure obtained after the first mask structure is formed according to an embodiment of the disclosure. Further, as shown in FIG. 2, when the MTJ structure 102 is formed on a substrate 101, in some embodiments, the MTJ structure 102 may include an MTJ layer 1021 and an MTJ mask layer

1022. The MTJ layer 1021 is formed on the substrate 101. The MTJ mask layer 1022 is formed on the MTJ layer 1021.

It is to be noted that, as shown in FIG. 2, in the embodiment of the disclosure, the MTJ structure 102 may specifically include the MTJ layer 1021 and the MTJ mask layer 1022. The MTJ layer 1021 is the part including the components of the magnetic tunnel junctions, and is directly formed on the substrate 101. The MTJ mask layer 1022 is formed on the MTJ layer 1021, and serves as the top electrode in a final semiconductor structure.

As shown in FIG. 2, after the MTJ structure 102 is formed on the substrate 101, the first mask structure 103 continues to be formed on the MTJ structure. Specifically, the first mask structure 103 is formed on the MTJ mask layer 1022. The first mask structure 103 may be a photoresist layer.

In a specific example, for the structure shown in FIG. 2, the MTJ layer 1021 may specifically include (from bottom to top) a buffer layer, a pinning layer, a reference layer, a tunneling barrier, a free layer, and a cap layer. The material of the buffer layer may include tantalum (Ta), platinum (Pt) or nickel-iron (NiFe). The material of the pinning layer may include a cobalt/platinum composite ([Co/Pt]n) or a cobalt/palladium composite ([Co/Pd]n). The material of the reference layer may include cobalt-iron (CoFe), cobalt (Co) or cobalt-iron-boron (CoFeB). The material of the tunneling barrier may include magnesium oxide (MgO) or alumina (Alox). The material of the free layer may include CoFe or CoFeB. The material of the cap layer may include ruthenium (Ru) or Ta.

The MTJ mask layer 1022 may specifically include (from bottom to top) a metal layer and a dielectric layer. The material of the metal layer may include tantalum, tantalum nitride (TaN), titanium nitride (TiN) or titanium (Ti). The material of the dielectric layer may include silicon nitride (SiNx), silicon oxide (SiOx) or carbide. In an example of the embodiment of the disclosure, the MTJ mask layer may include a dielectric layer.

The first mask structure 103 may specifically include (from bottom to top) a bottom anti-reflection coating (BARC) and a photoresist.

In S103, a patterning process is performed on the first mask structure to form a first pattern extending in a first direction.

It is to be noted that, in the embodiment of the disclosure, the patterning process may be performed on the first mask structure by self-aligned double patterning (SADP), thereby forming the first pattern extending in the first direction. The SADP can realize pattern multiplication to graphics with multiple processes.

In some embodiments, the operation that a patterning process is performed on the first mask structure to form a first pattern extending in a first direction may include the following operations.

The first mask structure is etched in the first direction to form a patterned first mask structure.

A first dielectric layer covering the first mask structure is formed on the MTJ mask layer, and the surface of the first dielectric layer is provided with first trenches arranged at intervals with the first mask structure.

The first dielectric layer that is located on a plane of a top of the first mask structure and that is located below the first trenches is removed.

The first mask structure is removed to form the first pattern extending in the first direction.

Figure 3A:
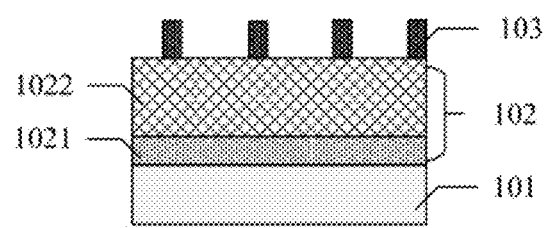
FIG. 3A is a schematic diagram of the structure obtained after a patterned first mask structure is formed according to an embodiment of the disclosure.
Figure 3B:
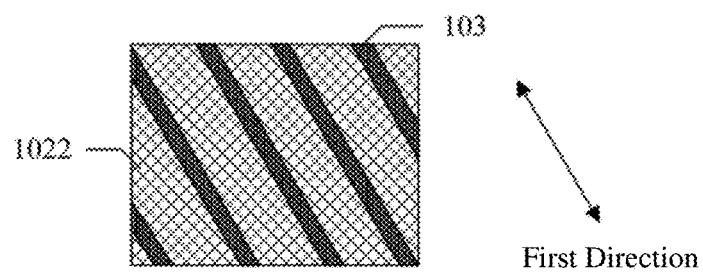
FIG. 3B is a top view of the structure obtained after a patterned first mask structure is formed according to an embodiment of the disclosure.
Figure 4A:
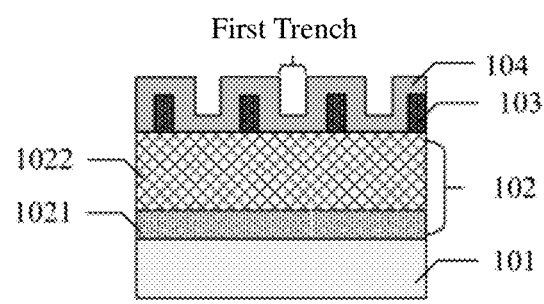
FIG. 4A is a schematic diagram of the structure obtained after a first dielectric layer is formed according to an embodiment of the disclosure.
Figure 4B:
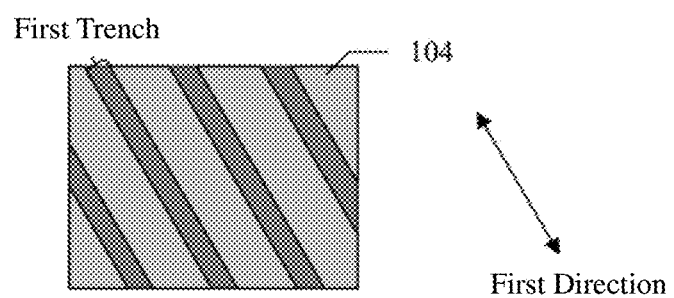
FIG. 4B is a top view of the structure obtained after a first dielectric layer is formed according to an embodiment of the disclosure.
Figure 5A:
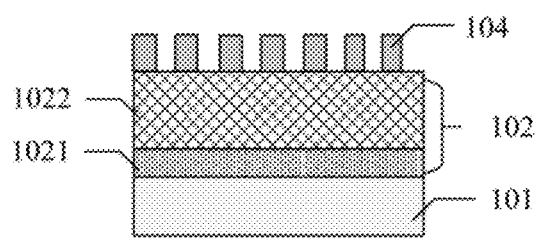
FIG. 5A is a schematic diagram of the structure obtained after a first pattern is formed according to an embodiment of the disclosure.
Figure 5B:
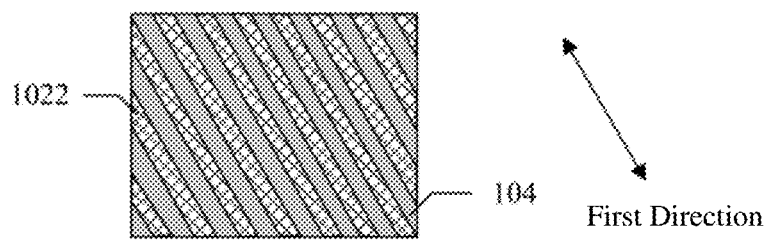
FIG. 5B is a top view of the structure obtained after a first pattern is formed according to an embodiment of the disclosure.

It is to be noted that, referring to FIG. 3A, FIG. 3A is a schematic diagram of the structure obtained after a patterned first mask structure is formed according to an embodiment of the disclosure, referring to FIG. 3B, FIG. 3B is a top view of the structure obtained after a patterned first mask structure is formed according to an embodiment of the disclosure, referring to FIG. 4A, FIG. 4A is a schematic diagram of the structure obtained after a first dielectric layer is formed according to an embodiment of the disclosure, referring to FIG. 4B, FIG. 4B is a top view of the structure obtained after a first dielectric layer is formed according to an embodiment of the disclosure, referring to FIG. 5A, FIG. 5A is a schematic diagram of the structure obtained after a first pattern is formed according to an embodiment of the disclosure, and referring to FIG. 5B, FIG. 5B is a top view of the structure obtained after a first pattern is formed according to an embodiment of the disclosure.

When the first mask structure is patterned, as shown in FIGS. 3A and 3B, the first mask structure 103 is etched in the first direction, namely the first mask structure 103 is patterned in the first direction, thereby forming the patterned first mask structure 103. In such case, the formed patterns are spaced with a relatively large distance.

Then, as shown in FIGS. 4A and 4B, the first dielectric layer 104 covering the first mask structure 103 is formed on the MTJ structure 102. The first dielectric layer 104 covers the patterned first mask structure 103, and the first trenches which spaced from the patterned first mask structure 103 are provided on the surface of the first dielectric layer 104.

It is to be noted that, in FIG. 4B, the first trenches are shown in a deep color for ease of representation.

Finally, as shown in FIGS. 5A and 5B, the first dielectric layer 104 which is located on the first mask structure 103 and below the first trenches are removed, and the first mask structure 103 is removed, thereby obtaining a first pattern extending in the first direction (i.e., the patterned first dielectric layer 104).

In S104, the first pattern is transferred to the MTJ structure.

In S105, a second mask structure is formed on the MTJ structure.

In S106, the second mask structure is patterned to form a second pattern extending in a second direction.

In S107, the MTJ structure is patterned with the second pattern to form a cellular MTJ array.

It is to be noted that, for S104 to S107, two implementation modes are provided in the embodiments of the disclosure. The first implementation mode will now be described in detail.

In the first implementation mode, for S104, in some embodiments, the operation that the first pattern is transferred to the MTJ structure may include the following operation.

The first pattern is transferred to the MTJ mask layer by taking the first dielectric layer as a mask.

Figure 6A:
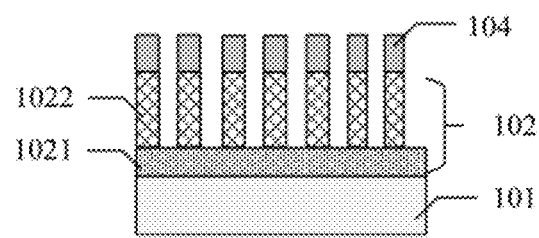
FIG. 6A is a schematic diagram of the structure obtained after a first pattern is transferred to an MTJ structure according to an embodiment of the disclosure.
Figure 6B:
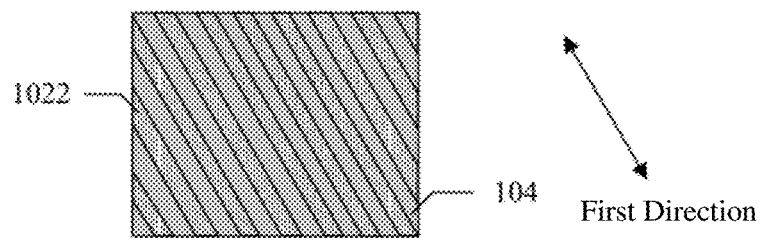
FIG. 6B is a top view of the structure obtained after a first pattern is transferred to an MTJ structure according to an embodiment of the disclosure.

It is to be noted that, referring to FIG. 6A, FIG. 6A is a schematic diagram of the structure obtained after the first pattern is transferred to the MTJ structure according to the embodiment of the disclosure. Referring to FIG. 6B, FIG. 6B is a top view of the structure obtained after the first pattern is transferred to the MTJ structure according to the embodiment of the disclosure.

Referring to FIGS. 6A and 6B, in this implementation mode, transferring the first pattern to the MTJ structure 102 refers to transferring the first pattern to the MTJ mask layer 1022. Specifically, the MTJ mask layer exposed from the first dielectric layer 104 can be etched to transfer the first pattern to the MTJ mask layer.

For S105, in some embodiments, before the operation that the second mask structure is formed on the MTJ structure, the method may further include that: a first sacrificial layer covering the MTJ mask layer and the first dielectric layer is formed on the MTJ layer.

It is to be noted that, before the second mask structure is formed, the first sacrificial layer covering the MTJ mask layer and the first dielectric layer is firstly formed on the MTJ layer. The top surface of the first sacrificial layer may be flush with that of the first dielectric layer, or slightly higher than the top surface of the first dielectric layer. A specific height of the first sacrificial layer is related to practical processing parameters and processing level. No specific limits are made thereto in the embodiment of the disclosure.

For S106, in some embodiments, the second mask structure includes a first photoresist layer and a second dielectric layer. The operation that the second mask structure is patterned to form the second pattern extending in the second direction may include the following operations.

The first photoresist layer is formed on the first sacrificial layer and the first dielectric layer.

The first photoresist layer is etched in the second direction to form the patterned first photoresist layer.

The second dielectric layer covering the first photoresist layer is formed on the first sacrificial layer, and second trenches arranged at intervals with the first photoresist layer are provided on the surface of the second dielectric layer.

The second dielectric layer located on plane of the top of the first photoresist layer and below the second trenches is removed.

The first photoresist layer is removed to form the second pattern extending in the second direction.

It is to be noted that, in this implementation mode, the second mask structure may specifically include a first photoresist layer and a second dielectric layer. In the embodiment of the disclosure, the patterning process may be performed on the second mask structure by SADP to form the second pattern extending in the second direction.

Figure 7:
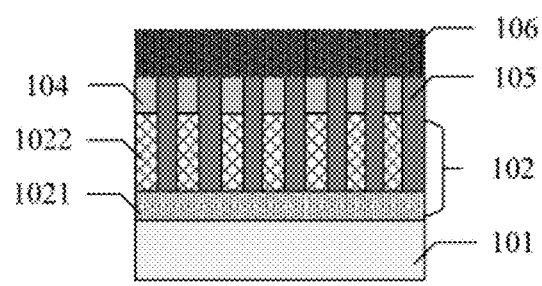
FIG. 7 is a schematic diagram of the structure obtained after a first photoresist layer is formed according to an embodiment of the disclosure.
Figure 8A:
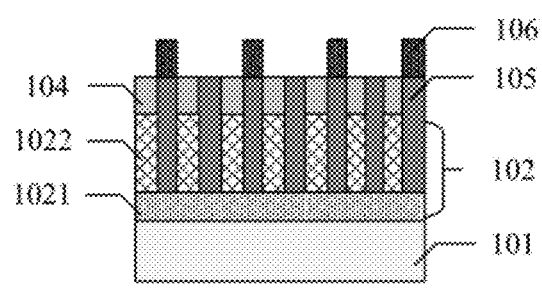
FIG. 8A is a schematic diagram of the structure obtained after a patterned first photoresist layer is formed according to an embodiment of the disclosure.
Figure 8B:
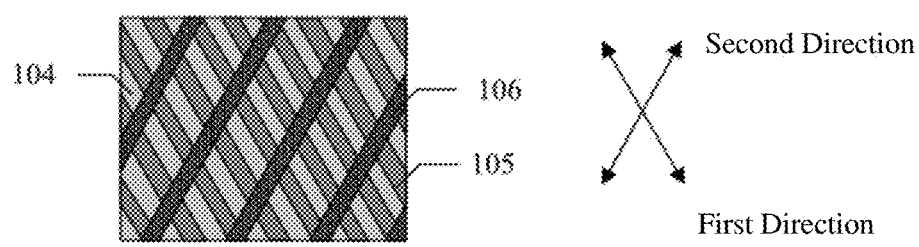
FIG. 8B is a top view of the structure obtained after a patterned first photoresist layer is formed according to an embodiment of the disclosure.
Figure 9A:
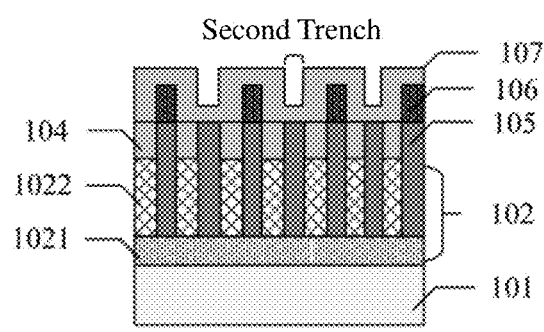
FIG. 9A is a schematic diagram of the structure obtained after a second dielectric layer is formed according to an embodiment of the disclosure.
Figure 9B:
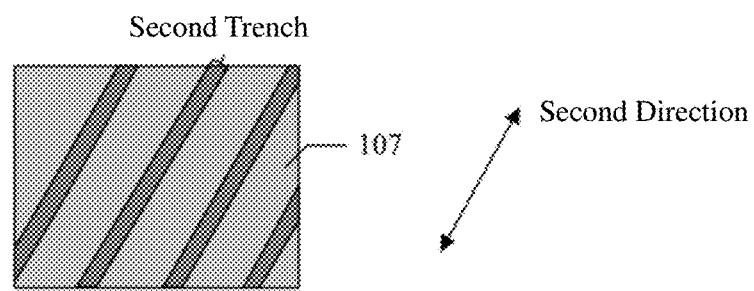
FIG. 9B is a top view of the structure obtained after a second dielectric layer is formed according to an embodiment of the disclosure.
Figure 10A:
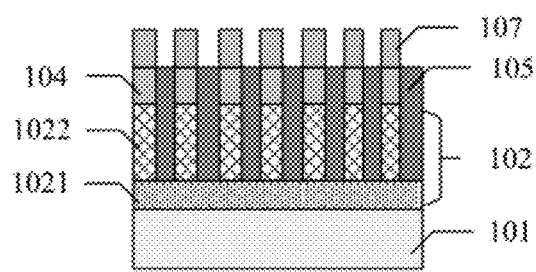
FIG. 10A is a schematic diagram of the structure obtained after a second pattern is formed according to an embodiment of the disclosure.
Figure 10B:
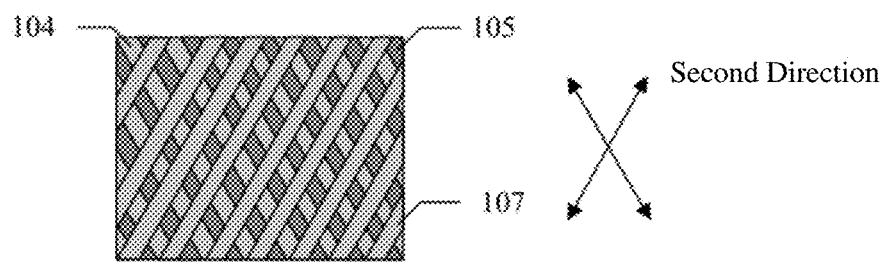
FIG. 10B is a top view of the structure obtained after a second pattern is formed according to an embodiment of the disclosure.

Specifically, referring to FIG. 7, FIG. 7 is a schematic diagram of the structure obtained after the first photoresist layer is formed according to an embodiment of the disclosure. Referring to FIG. 8A, FIG. 8A is a schematic diagram of the structure obtained after the patterned first photoresist layer is formed according to an embodiment of the disclosure. Referring to FIG. 8B, FIG. 8B is a top view of the structure obtained after the patterned first photoresist layer is formed according to an embodiment of the disclosure. Referring to FIG. 9A, FIG. 9A is a schematic diagram of the structure after the second dielectric layer is formed according to an embodiment of the disclosure. Referring to FIG. 9B, FIG. 9B is a top view of the structure after the second dielectric layer is formed according to an embodiment of the disclosure. Referring to FIG. 10A, FIG. 10A is a schematic diagram of the structure after the second pattern is formed according to an embodiment of the disclosure. Referring to FIG. 10B, FIG. 10B is a top view of the structure after the second pattern is formed according to an embodiment of the disclosure.

When the second mask structure is patterned, as shown in FIG. 7, the first sacrificial layer 105 covering the MTJ mask layer 1022 and the first dielectric layer 104 is firstly formed on the MTJ layer 1021. The first photoresist layer 106 is formed on the first sacrificial layer 105 (in the figures of the embodiment of the disclosure, the top surface of the first sacrificial layer 105 is, for example, flush with that of the first dielectric layer 104) and the first dielectric layer 104.

As shown in FIGS. 8A and 8B, an etching process is performed on the first photoresist layer 106 in the second direction to obtain the patterned first photoresist layer 106. The first direction intersects the second direction, and is not perpendicular to the second direction.

As shown in FIGS. 9A and 9B, the second dielectric layer 107 covering the first photoresist layer 106 is formed on the first sacrificial layer 105. In FIG. 9A, specifically, the second dielectric layer 107 is formed on the first sacrificial layer 105 and the first dielectric layer 104, and encloses the first photoresist layer 106. The second trenches spaced from the first photoresist layer 106 are provided on the surface of the second dielectric layer 107.

It is to be noted that, in FIG. 9B, the second trenches are shown in a deep color for ease of representation.

As shown in FIGS. 10A and 10B, the second dielectric layer 107 on a top surface of the first photoresist layer 106 and below the second trenches is removed, and the first photoresist layer 106 is removed, thereby obtaining the patterned second dielectric layer 107, i.e., the second pattern. The second pattern extends in the second direction.

For S107, in some embodiments, the operation that the MTJ structure is patterned by utilizing the second pattern to form the cellular MTJ array may include the following operations.

The first dielectric layer, the first sacrificial layer and the MTJ mask layer are patterned by taking the second dielectric layer as a mask, and the first sacrificial layer and the second dielectric layer are removed, so as to form the cellular pattern with the remaining first dielectric layer and MTJ mask layer.

The first dielectric layer is removed, the cellular pattern is transferred to the MTJ layer by taking the MTJ mask layer as a mask, and the MTJ mask layer in the vertical direction is partially removed to obtain the cellular MTJ array.

It is to be noted that, in this implementation mode, when the cellular MTJ array is formed, the first dielectric layer, the first sacrificial layer and the MTJ mask layer are patterned by taking the second dielectric layer as a mask, and the first sacrificial layer and the second dielectric layer are removed, so as to transfer the second pattern to the first dielectric layer and the MTJ mask layer. Since the first pattern has been formed in the first dielectric layer and the MTJ mask layer in the above-mentioned operations, the first dielectric layer and MTJ mask layer obtained in this operation have both the first pattern and the second pattern, which together form the cellular pattern.

Figure 11A:
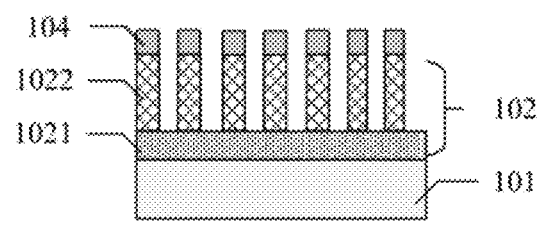
FIG. 11A is a schematic diagram of the structure obtained after a cellular pattern is formed according to an embodiment of the disclosure.
Figure 11B:
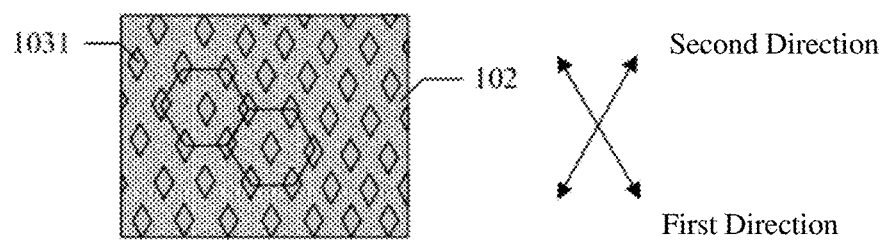
FIG. 11B is a top view of the structure obtained after a cellular pattern is formed according to an embodiment of the disclosure.

Specifically, referring to FIG. 11A, FIG. 11A is a schematic diagram of the structure obtained after the cellular pattern is formed according to the embodiment of the disclosure. Referring to FIG. 11B, FIG. 11B is a top view of the structure obtained after the cellular pattern is formed according to the embodiment of the disclosure.

As shown in FIG. 11B, for the first dielectric layer 103 and MTJ mask layer 1022, each unit thereof (each pillar formed by the first dielectric layer 104 and the MTJ mask layer 1022 is referred to as one unit) is surrounded by six units, and the six units are connected with one another to present a shape of honeycomb.

Figure 12A:
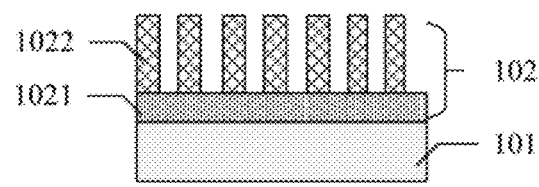
FIG. 12A is a schematic diagram of the structure obtained after a first dielectric layer is removed according to an embodiment of the disclosure.
Figure 12B:
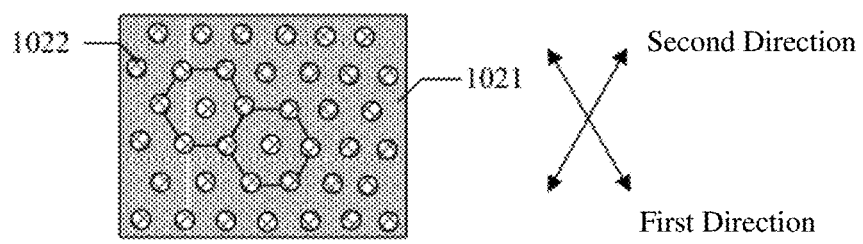
FIG. 12B is a top view of the structure obtained after a first dielectric layer is removed according to an embodiment of the disclosure.

After the cellular pattern is obtained, the first dielectric layer is removed to obtain the MTJ mask layer with the cellular pattern. Specifically, referring to FIG. 12A, FIG. 12A is a schematic diagram of the structure obtained after the first dielectric layer is removed according to the embodiment of the disclosure. Referring to FIG. 12B, FIG. 12B is a top view of the structure obtained after the first dielectric layer is removed according to the embodiment of the disclosure.

It is to be noted that the patterns may be adjusted in practical patterning processes, so that each unit in the formed cellular pattern is usually cylindrical. That is, each unit from the top view in FIG. 12B is round.

Figure 13A:
FIG. 13A is a structural schematic diagram of a cellular MTJ array according to an embodiment of the disclosure.
Figure 13B:
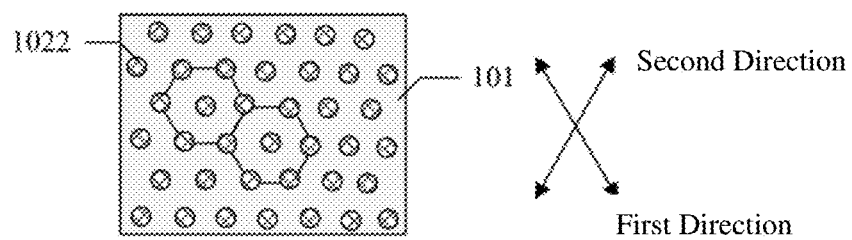
FIG. 13B is a top view of a cellular MTJ array according to an embodiment of the disclosure.

The cellular pattern is transferred to the MTJ layer by taking the MTJ mask layer as a mask, and the MTJ mask layer is partially removed in the vertical direction to finally obtain the cellular MTJ array. Specifically, referring to FIG. 13A, FIG. 13A is a schematic diagram of the structure of the cellular MTJ array according to the embodiment of the disclosure. Referring to FIG. 13B, FIG. 13B is a top view of the cellular MTJ array obtained according to the embodiment of the disclosure.

Further, in this implementation mode, the height ratio of the MTJ mask layer to the MTJ layer may range from 1.5:1 to 3:1 before transferring the second pattern to the MTJ structure to form the cellular MTJ array. The height ratio of the MTJ mask layer to the MTJ layer may range from 0.5:1 to 1.5:1 after transferring the second pattern to the MTJ structure to form the cellular MTJ array.

It is to be noted that, referring to FIGS. 12A and 13A, both the MTJ layer 1021 and the MTJ mask layer 1022 are usually made from metal materials, so that the MTJ mask layer 1022 may be partially removed while the MTJ layer is patterned when the pattern is being transferred. Therefore, in the MTJ structure before transferring the cellular pattern to the MTJ structure to form the cellular MTJ array, the height ratio of the MTJ mask layer 1022 to the MTJ layer 1021 ranges from 1.5:1 to 3:1. That is, the height ratio of the MFJ mask layer 1022 to the MTJ layer 1021 may be set within the range of 1.5:1 to 3:1 at the beginning of forming the MTJ structure 102. As such, the MTJ mask layer 1022 is prevented from being consumed excessively during transferring the pattern, and a proper height ratio of the MTJ mask layer 1022 and the MTJ layer 1021 in the finally obtained MTJ array can be achieved. Preferably, the height ratio of the MTJ mask layer to the MTJ layer in the finally formed cellular MTJ array ranges from 0.5:1 to 1.5:1.

It is also to be noted that, in this implementation mode, when the cellular MTJ array is formed, the pattern in the first direction may not be transferred to the MTJ mask layer, and instead, the surplus MTJ mask layer may be removed after the second pattern is formed and transferred to the MTJ mask layer. As such, the cellular MTJ array may also be obtained. That is, those skilled in the art may adjust the specific patterning process reasonably in combination with an actual scene and process requirements. No specific limits are made thereto in the embodiment of the disclosure.

The specific processes for performing S104 to S107 in the first implementation mode provided in the embodiment of the disclosure are described above. Specific processes for performing S104 to S107 in the second implementation mode will now be described below.

In the second implementation mode, for S104, in some embodiments, the operation that the first pattern is transferred to the MTJ structure may include the following operation.

The first pattern is transferred to the MTJ mask layer and the MTJ layer by taking the first dielectric layer as a mask.

Figure 14A:
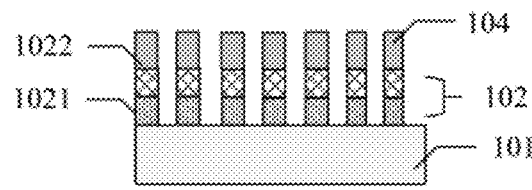
FIG. 14A is a schematic diagram of another structure obtained after a first pattern is transferred to an MTJ structure according to an embodiment of the disclosure.
Figure 14B:
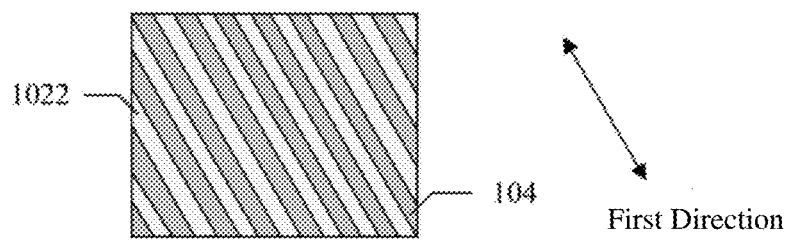
FIG. 14B is a top view of another structure obtained after a first pattern is transferred to an MTJ structure according to an embodiment of the disclosure.

It is to be noted that, referring to FIG. 14A, FIG. 14A is a schematic diagram of another structure obtained after the first pattern is transferred to the MTJ structure according to an embodiment of the disclosure. Referring to FIG. 14B, FIG. 14B is a top view of another structure obtained after the first pattern is transferred to the MTJ structure according to an embodiment of the disclosure.

As shown in FIGS. 14A and 14B, in this implementation mode, transferring the first pattern to the MTJ structure 102 refers to transferring the first pattern to the MTJ mask layer 1022 and the MTJ layer 1021. Specifically, the MTJ mask layer 1022 exposed from the first dielectric layer 104 is etched to transfer the first pattern to the MTJ mask layer 1022, and then the MTJ layer exposed from the MTJ mask layer 1022 continues to be removed to transfer the pattern to the MTJ layer 1021.

For S105, in some embodiments, before the operation that the second mask structure is formed on the MTJ structure, the method may further include that: a second sacrificial layer covering the MTJ layer, the MTJ mask layer and the first dielectric layer is formed on the substrate.

It is to be noted that, before the second mask structure is formed, the second sacrificial layer covering the MTJ layer, the MTJ mask layer and the first dielectric layer is firstly formed on the substrate. The top surface of the second sacrificial layer may be flush with that of the first dielectric layer, or slightly higher than that of the first dielectric layer. The height of the second sacrificial layer is related to practical process parameters and the process level. No specific limits are made thereto in the embodiment of the disclosure.

For S106, in some embodiments, the second mask structure includes a second photoresist layer and a third dielectric layer. The operation that the second mask structure is patterned to form the second pattern extending in the second direction may include the following operations.

The second photoresist layer is formed on the second sacrificial layer and the first dielectric layer.

The second photoresist layer is etched in the second direction to form a patterned second photoresist layer.

The third dielectric layer covering the second photoresist layer is formed on the second sacrificial layer, third trenches arranged at interval with the second photoresist layer are provided on surface of the third dielectric layer.

The third dielectric layer located on the plane of the top of the second photoresist layer and below the third trenches is removed.

The second photoresist layer is removed to form the second pattern extending in the second direction.

It is to be noted that, in this implementation mode, the second mask structure may specifically include the second photoresist layer and the third dielectric layer. In the embodiment of the disclosure, the patterning process may be performed on the second mask structure by SADP to form the second pattern extending in the second direction.

Figure 15:
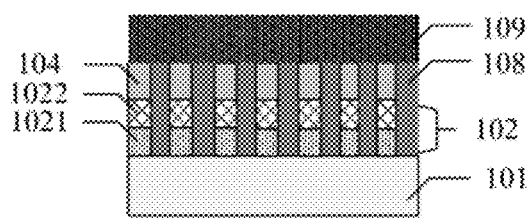
FIG. 15 is a schematic diagram of the structure obtained after a second photoresist layer is formed according to an embodiment of the disclosure.
Figure 18A:
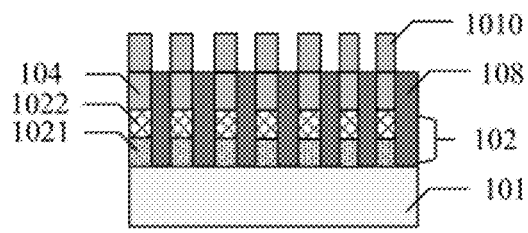
FIG. 18A is a schematic diagram of another structure obtained after a second pattern is formed according to an embodiment of the disclosure.
Figure 18B:
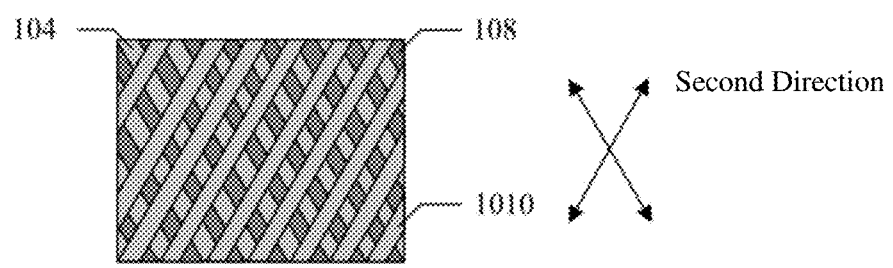
FIG. 18B is a top view of another structure obtained after a second pattern is formed according to an embodiment of the disclosure.
Figure 19A:
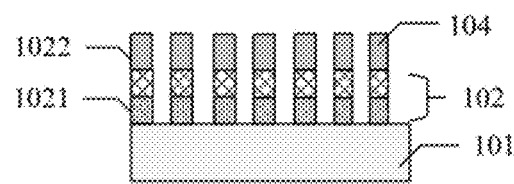
FIG. 19A is a schematic diagram of another structure obtained after a cellular pattern is formed according to an embodiment of the disclosure.
Figure 19B:
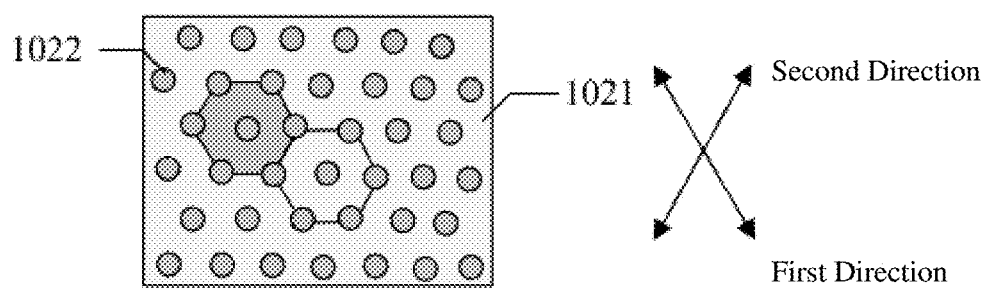
FIG. 19B is a top view of another structure obtained after a cellular pattern is formed according to an embodiment of the disclosure.

Specifically, referring to FIG. 15, FIG. 15 is a schematic diagram of the structure obtained after the second photoresist layer is formed according to the embodiment of the disclosure. Referring to FIG. 18A, FIG. 18A is a schematic diagram of the structure obtained after the patterned second photoresist layer is formed according to the embodiment of the disclosure. Referring to FIG. 18B, FIG. 18B is a top view of the structure obtained after the patterned second photoresist layer is formed according to the embodiment of the disclosure. Referring to FIG. 19A, FIG. 19A is a schematic diagram of the structure after the third dielectric layer is formed according to the embodiment of the disclosure. Referring to FIG. 19B, FIG. 19B is a top view of the structure after the third dielectric layer is formed according to the embodiment of the disclosure. Referring to FIG. 20A, FIG. 20A is structure schematic diagram of another structure after the second pattern is formed according to the embodiment of the disclosure. Referring to FIG. 20B, FIG. 20B is a top view of another structure after the second pattern is formed according to the embodiment of the disclosure.

In this implementation mode, when the second mask structure is patterned, as shown in FIG. 15, the second sacrificial layer 108 covering the MTJ layer 1021, the MTJ mask layer 1022 and the first dielectric layer 104 is formed on the substrate 101. The second photoresist layer 109 is formed on the second sacrificial layer 108 (in the figures of the embodiment of the disclosure, as an example, the top surface of the second sacrificial layer 108 is flush with that of the first dielectric layer 104) and the first dielectric layer 104.

Figure 16A:
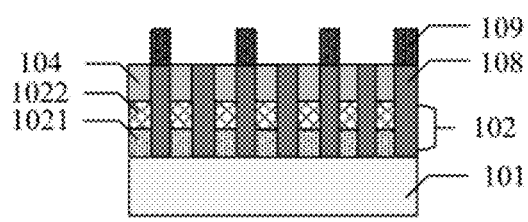
FIG. 16A is a schematic diagram of the structure obtained after a patterned second photoresist layer is formed according to an embodiment of the disclosure.
Figure 16B:
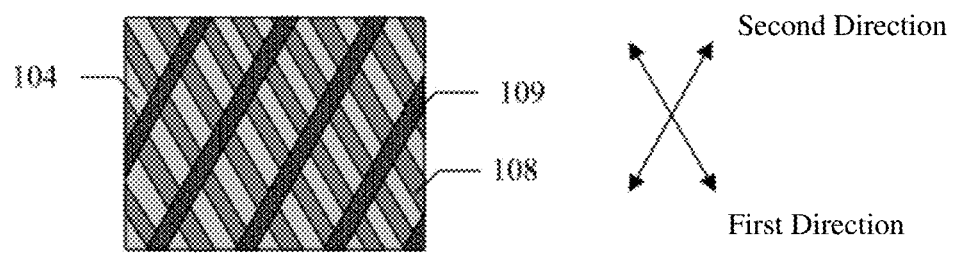
FIG. 16B is a top view of the structure obtained after a patterned second photoresist layer is formed according to an embodiment of the disclosure.

As shown in FIGS. 16A and 16B, the second photoresist layer 109 is etched in the second direction to obtain the patterned second photoresist layer 109. The first direction intersects the second direction, and is not perpendicular to the second direction.

Figure 17A:
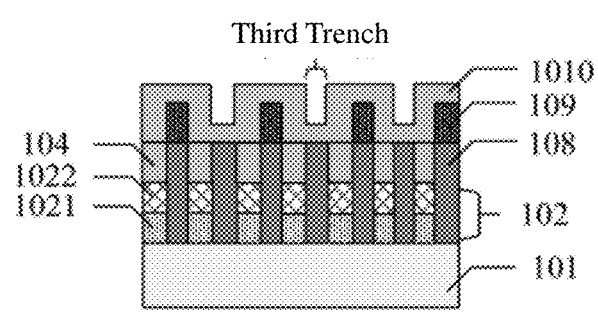
FIG. 17A is a schematic diagram of the structure obtained after a third dielectric layer is formed according to an embodiment of the disclosure.
Figure 17B:
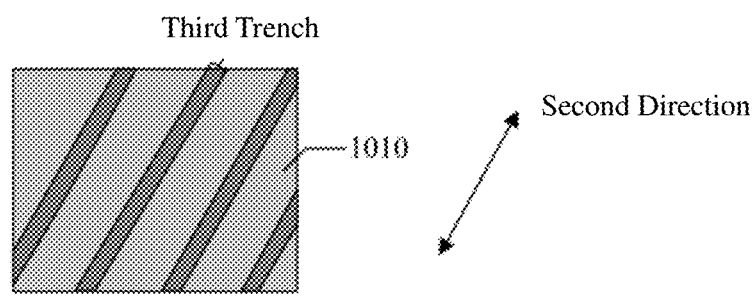
FIG. 17B is a top view of the structure obtained after a third dielectric layer is formed according to an embodiment of the disclosure.

As shown in FIGS. 17A and 17B, the third dielectric layer 1010 covering the second photoresist layer 109 is formed on the second sacrificial layer 108. In FIG. 17A, specifically, the third dielectric layer 1010 is formed on the second sacrificial layer 108 and the first dielectric layer 104, and encloses the second photoresist layer 109. The third trenches spaced from the second photoresist layer 109 are provided on the surface of the third dielectric layer 1010.

It is to be noted that, in FIG. 17B, the third trenches are shown in a deep color for ease of representation.

As shown in FIGS. 18A and 18bB, the third dielectric layer 1010 located on the top surface of the second photoresist layer 109 and below the third trenches is removed, and the second photoresist layer 109 is removed, thereby obtaining the patterned third dielectric layer 1010, i.e., the second pattern. The second pattern extends in the second direction.

For S107, in some embodiments, the operation that the MTJ structure is patterned by utilizing the second pattern to form the cellular MTJ array may include the following operations.

The first dielectric layer, the second sacrificial layer and the MTJ structure are patterned by taking the third dielectric layer as a mask, and the second sacrificial layer and the third dielectric layer are removed, so as to form the cellular pattern with the remaining first dielectric layer and MTJ structure.

The first dielectric layer is removed to obtain the cellular MTJ array.

It is to be noted that, in this implementation mode, when the cellular MTJ array is formed, the first dielectric layer, the second sacrificial layer and the MTJ structure are patterned by taking the third dielectric layer as a mask, and the second sacrificial layer and the third dielectric layer are removed, so as to transfer the second pattern to the first dielectric layer and the MTJ structure (i.e., the MTJ mask layer and the MTJ layer). Since the first pattern has been formed in the first dielectric layer, the MTJ mask layer and the MTJ layer in the above-mentioned operations, the first dielectric layer, MTJ mask layer and MTJ layer obtained in this operation have both the first pattern and the second pattern, which together form the cellular pattern.

Specifically, referring to FIG. 19A, FIG. 19A is a schematic diagram of another structure obtained after the cellular pattern is formed according to the embodiment of the disclosure. Referring to FIG. 19B, FIG. 19B is a top view of another structure obtained after the cellular pattern is formed according to the embodiment of the disclosure.

As shown in FIG. 19A, for the first dielectric layer 103 and MTJ structure 102, six units around each unit thereof (in which each pillar of the first dielectric layer 104 and the MTJ structure 102 is referred to as one unit) are connected with one another to present a shape of honeycomb.

It is to be noted that the pattern may be adjusted in a practical patterning process, so that each unit in the formed cellular pattern is usually cylindrical. That is, each unit from the top view in FIG. 19B is round.

After the cellular pattern is obtained, the first dielectric layer 104 is removed to obtain the cellular MTJ array. The schematic diagram of the cellular MTJ array may specifically refer to FIGS. 13A and 13B.

Further, in this implementation mode, the height ratio of the MTJ mask layer to the MTJ layer may range from 0.5:1 to 1.5:1.

It is to be noted that, referring to FIGS. 13A to 19B, in this implementation mode, when the first pattern is transferred, the first pattern is transferred directly to the MTJ layer by taking the first dielectric layer as a mask, and when the second pattern is transferred, the second pattern is transferred to the MTJ layer by taking the third dielectric layer as a mask. That is, the consumption of the MTJ mask layer is almost avoided when the MTJ layer is patterned. Therefore, the MTJ mask layer and the MTJ layer are formed directly according to the height ratio of 0.5:1 to 1.5:1 when initially forming the MTJ mask layer and the MTJ layer.

It is also to be noted that, in this implementation mode, when the cellular MTJ array is formed, the pattern in the first direction may not be transferred to the MTJ mask layer, and instead, the surplus MTJ structure may be removed after the second pattern is formed and transferred to the MTJ structure. As such, the cellular MTJ array may also be obtained. That is, those skilled in the art may adjust the specific patterning processes reasonably in combination with an actual scene and process requirements. No specific limits are made thereto in the embodiment of the disclosure.

That is, the MTJ array obtained in the embodiment of the disclosure has the cellular pattern, and includes two layers of structures, i.e., the MTJ layer and the MTJ mask layer. The MTJ mask layer serves as a top electrode of the semiconductor structure.

Further, after the operation that the cellular MTJ array is formed, the method may further include the following operation.

An insulating layer covering the cellular MTJ array is formed on the substrate.

Figure 20:
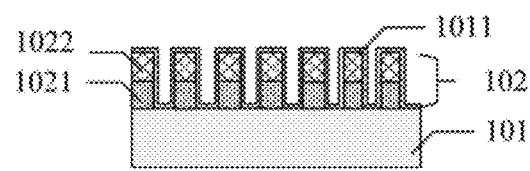
FIG. 20 is a structural schematic diagram of a semiconductor structure according to an embodiment of the disclosure.

It is to be noted that, referring to FIG. 20, FIG. 20 is a schematic diagram of the structure of a semiconductor structure according to an embodiment of the disclosure. As shown in FIG. 20, after the MTJ array is formed, an insulating layer 1011 covering the MTJ array is further formed on the substrate in the embodiment of the disclosure. For example, the insulating layer is formed by a process such as deposition. The material of the insulating layer 1011 may include SiNx, SiOx or the like.

Further, in some embodiments, an included angle between the first direction and the second direction is 60 degrees, and the cellular pattern is a hexagonal pattern. It is to be noted that, the included angle between the first direction and the second direction is preferably 60°, and the cellular pattern is a hexagonal pattern. Therefore, the density of the MTJ array may be improved maximally.

It is to be noted that, in the embodiment of the disclosure, the material of each of the first dielectric layer, the second dielectric layer and the third dielectric layer may include silicon oxide (SiO or $SiO_2$) or the like. The material of each of the first sacrificial layer and the second sacrificial layer may include spin on carbon (SOC). During the formation of each layer of the structure, a corresponding suitable process such as deposition or the like, e.g., chemical vapor deposition (CVD) and physical vapor deposition (PVD), may be used according to the characteristics of specifically selected materials. During the removal of each layer of the structure, a suitable etching process, such as photo-etching, dry etching, wet etching or the like, may be selected according to characteristics of the material needed to be etched.

The MTJ array with the cellular pattern in the embodiments of the disclosure is the MTJ array with a hexagonal pattern. The hexagonal array is obtained by the method for manufacturing a semiconductor structure in the embodiments of the disclosure. The array is a hexagonally cellular. Compared with an orthogonal array (the array is square) under the same cell spacing, memory cells of the hexagonally cellular array is much smaller and the memory density is higher, so that, under the same storage area, the semiconductor structure obtained in the embodiments of the disclosure may store more data. In addition, under the same memory density, the better symmetry and larger spacing of the hexagonal array are more conducive to the etching for forming the MTJ array, so that the challenges in patterning of the MTJ array are solved.

In summary, the method for manufacturing a semiconductor structure in the embodiments of the disclosure may be implemented at least by the following two implementation modes.

The first mode includes the following operations. Step 1, an MTJ layer, an MTJ mask layer and a first mask structure are deposited on a substrate. Step 2, a first pattern is formed on the first mask structure by SADP process. Step 3, the first pattern is transferred to the MTJ mask layer. Step 4, a second pattern is formed on the first pattern by SADP process. Step 5, the second pattern is transferred to the MTJ mask layer to form a cellular pattern. Step 6, the cellular pattern is transferred to the MTJ layer to form a cellular MTJ array.

The second mode includes the following operations. Step 1, an MTJ layer, an MTJ mask layer and a first mask structure are deposited on a substrate. Step 2, a first pattern is formed on the first mask structure by SADP process. Step 3, the first pattern is transferred to the MTJ mask layer and the MTJ layer. Step 4, a second pattern is formed on the first pattern by SADP process. Step 5, the second pattern is transferred to the MTJ mask layer and the MTJ layer to obtain a cellular MTJ array.

The cellular MTJ array in the semiconductor structure manufactured by the method for manufacturing a semiconductor structure in the embodiments of the disclosure is high in density, and the shadow effect is mitigated greatly during patterning processes. In addition, the solution may be applied to a patterning solution of a DRAM, namely compatible with a DRAM platform. A cellular pattern with small-spacing can be obtained by the method. Particularly in the second mode, the consumption of the MTJ mask layer can be avoided during the patterning of the MTJ layer. That is, the embodiments of the disclosure particularly relate to the manufacturing of a MRAM chip, particularly high-density MTJ patterning, in which the hexagonally cellular high-density MTJ array is patterned by SADP technology, which can be applied to a high-density MRAM chip with small MTJ memory cells.

The embodiment of the disclosure provides a method for manufacturing a semiconductor structure, in which a cellular MTJ array is formed by the following operations. A substrate is provided. An MTJ structure and a first mask structure are formed sequentially on the substrate. A patterning process is performed on the first mask structure to form a first pattern extending in a first direction. The first pattern is transferred to the MTJ structure. A second mask structure is formed on the MTJ structure. A patterning process is performed on the second mask structure to form a second pattern extending in a second direction, in which the first direction intersects the second direction, and is not perpendicular to the second direction. A patterning process is performed on the MTJ structure by utilizing the second pattern to form the cellular MTJ array, in which the first pattern and the second pattern together form the cellular pattern. The cellular MTJ array is high in density, so that the memory density of a memory is improved when the memory is formed, and this particularly contributes to extending the application market of MRAMs. In addition, the cellular pattern is highly symmetrical, which is more conducive to etching in a high-density patterning process.

In another embodiment of the disclosure, referring to FIG. 20, FIG. 20 is a schematic diagram of the structure of the semiconductor structure according to an embodiment of the disclosure. As shown in FIG. 20, the semiconductor structure may include: a substrate 101; and a cellular MTJ array formed on the substrate 101, in which the cellular MTJ array is arranged in a cellular pattern, which includes a first pattern extending in a first direction and a second pattern extending in a second direction, the first direction intersects the second direction, and is not perpendicular to the second direction.

In some embodiments, the semiconductor structure further includes an insulating layer 1011. The insulating layer 1011 is formed on the substrate 101, and covers the cellular MTJ array.

Further, for the cellular MTJ array, in some embodiments, the cellular MTJ array may include an MTJ layer 1021 and an MTJ mask layer 1022. The MTJ layer 1021 is formed on the substrate 101. The MTJ mask layer 1022 is formed on the MTJ layer 1021.

Further, for the cellular MTJ array, in some embodiments, a height ratio of the MTJ mask layer 1022 to the MTJ layer 1021 in the cellular MTJ array may range from 0.5:1 to 1.5:1.

Further, for the MTJ mask layer, in some embodiments, a material of the MTJ mask layer may include one or more of tantalum, tantalum nitride, titanium nitride and titanium.

Further, for the cellular pattern, an included angle between the first direction and the second direction may be 60 degrees, and the cellular pattern may be a hexagonal pattern.

The embodiment of the disclosure provides a semiconductor structure, including a cellular MTJ array. The cellular MTJ array is high in density, so that the memory density of a memory may be improved when the memory is formed, and this particularly contributes to extending the application market of MRAMs.

Figure 21:
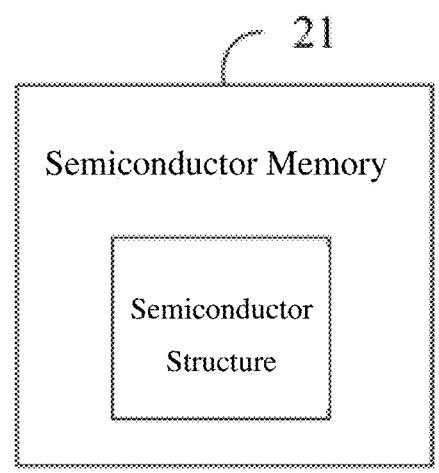
FIG. 21 is a structural schematic diagram of a semiconductor memory according to an embodiment of the disclosure.

In another embodiment of the disclosure, referring to FIG. 21, FIG. 21 is a schematic diagram of a semiconductor memory 21 according to an embodiment of the disclosure. As shown in FIG. 21, the semiconductor memory 21 may include the semiconductor structure as described in any one of the above-mentioned embodiments.

Further, the semiconductor memory includes a MRAM.

The semiconductor memory includes the semiconductor structure as described in the above-mentioned embodiments, so that the memory density thereof may be improved greatly, and the semiconductor memory can be applied to a wider market.

The above is only the preferred embodiment of the disclosure and not intended to limit the scope of protection of the disclosure.

It is to be noted that, in the disclosure, terms "include" and "contain" or any other variation thereof is intended to cover nonexclusive inclusions, so that a process, method, object, or device including a series of elements not only includes those elements, but also includes other elements that are not listed clearly, or further includes elements intrinsic to the process, the method, the object, or the device. With no more restrictions, an element defined by statement "including a/an" does not exclude the existence of the same other elements in a process, method, object, or device including the element.

The sequence numbers of the embodiments of the disclosure are only for description and do not represent superiority-inferiority of the embodiments.

The methods disclosed in some method embodiments provided in the disclosure may be combined freely under the situation that there is no conflicts to obtain new method embodiments.

The characteristics disclosed in some product embodiments provided in the disclosure may be combined freely under the situation that there is no conflicts to obtain new product embodiments.

The characteristics disclosed in some method or device embodiments provided in the disclosure may be combined freely under the situation that there is no conflicts to obtain new method embodiments or device embodiments.

The above is only the specific implementation mode of the disclosure and not intended to limit the scope of protection of the disclosure. Any variations or replacements apparent to those skilled in the art within the technical scope disclosed by the disclosure shall fall within the scope of protection of the disclosure. Therefore, the scope of protection of the disclosure shall be subject to the scope of protection of the claims.

According to the method for manufacturing a semiconductor structure, semiconductor structure and semiconductor memory in the embodiments of the disclosure, in which a substrate is provided; an MTJ structure and a first mask structure are formed sequentially on the substrate; a patterning process is performed on the first mask structure to form a first pattern extending in a first direction, the first pattern is transferred to the MTJ structure; a second mask structure is formed on the MTJ structure; a patterning process is performed on the second mask structure to form a second pattern extending in a second direction, in which the first direction intersects the second direction, and is not perpendicular to the second direction. A patterning process is performed on the MTJ perpendicular to the second direction; a patterning process is performed on the MTJ structure by utilizing the second pattern to form a cellular MTJ array, in which the first pattern and the second pattern together form a cellular pattern. As such, due to the high density of the cellular MTJ array, the memory density of the semiconductor memory is improved when the memory is formed, and it is advantageous for MRAMs to extend its application market. Moreover, the cellular pattern is highly symmetrical, which is more conducive to the patterning process when the MTJ layer is etched.

What is claimed is:

1. A method for manufacturing a semiconductor structure, comprising:
   providing a substrate;
   forming a magnetic tunnel junction (MTJ) structure and a first mask structure in sequence on the substrate;
   performing a patterning process on the first mask structure to form a first pattern extending in a first direction;
   transferring the first pattern to the MTJ structure;
   forming a second mask structure on the MTJ structure;
   performing a patterning process on the second mask structure to form a second pattern extending in a second direction, the first direction intersecting the second direction, and the first direction being not perpendicular to the second direction; and
   performing a patterning process on the MTJ structure by utilizing the second pattern to form a cellular MTJ array, the first pattern and the second pattern together forming a cellular pattern.

2. The method according to claim 1, wherein the MTJ structure comprises an MTJ layer and an MTJ mask layer, wherein the MTJ layer is formed on the substrate, and the MTJ mask layer is formed on the MTJ layer.

3. The method according to claim 2, wherein performing a patterning process on the first mask structure to form the first pattern extending in the first direction comprises:
   performing an etching process on the first mask structure in the first direction to form a patterned first mask structure;
   forming, on the MTJ mask layer, a first dielectric layer covering the first mask structure, first trenches arranged at intervals with the first mask structure being provided on a surface of the first dielectric layer;
   removing the first dielectric layer located on a plane of top of the first mask structure and located below the first trenches; and
   removing the first mask structure to form the first pattern extending in the first direction.

4. The method according to claim 3, wherein transferring the first pattern to the MTJ structure comprises:
   transferring the first pattern to the MTJ mask layer by taking the first dielectric layer as a mask.

5. The method according to claim 4, wherein a height ratio of the MTJ mask layer to the MTJ layer ranges from 1.5:1 to 3:1 before transferring of the second pattern to the MTJ structure to form the cellular MTJ array; and
   the height ratio of the MTJ mask layer to the MTJ layer ranges from 0.5:1 to 1.5:1 after transferring of the second pattern to the MTJ structure to form a cellular MTJ array.

6. The method according to claim 4, wherein before forming the second mask structure on the MTJ structure, the method further comprises:
   forming, on the MTJ layer, a first sacrificial layer covering the MTJ mask layer and the first dielectric layer.

7. The method according to claim 6, wherein the second mask structure comprises a first photoresist layer and a second dielectric layer; and
   wherein performing a patterning process on the second mask structure to form the second pattern extending in the second direction comprises:
   forming the first photoresist layer on the first sacrificial layer and the first dielectric layer;
   performing an etching process on the first photoresist layer in the second direction to form a patterned first photoresist layer;
   forming, on the first sacrificial layer, the second dielectric layer covering the first photoresist layer, second trenches arranged at intervals with the first photoresist layer being provided on a surface of the second dielectric layer;
   removing the second dielectric layer located on a plane of top of the first photoresist layer and located below the second trenches; and
   removing the first photoresist layer to form the second pattern extending in the second direction.

8. The method according to claim 7, wherein performing a patterning process on the MTJ structure by utilizing the second pattern to form the cellular MTJ array comprises:
- patterning the first dielectric layer, the first sacrificial layer and the MTJ mask layer by taking the second dielectric layer as a mask, and removing the first sacrificial layer and the second dielectric layer to form the cellular pattern with the remaining first dielectric layer and MTJ mask layer; and
- removing the first dielectric layer, transferring the cellular pattern to the MTJ layer by taking the MTJ mask layer as a mask, and partially removing the MTJ mask layer in a vertical direction to obtain the cellular MTJ array.

9. The method according to claim 3, wherein transferring the first pattern to the MTJ structure comprises:
- transferring the first pattern to the MTJ mask layer and the MTJ layer by taking the first dielectric layer as a mask.

10. The method according to claim 9, wherein before forming the second mask structure on the MTJ structure, the method further comprises:
- forming, on the substrate, a second sacrificial layer covering the MTJ layer, the MTJ mask layer and the first dielectric layer.

11. The method according to claim 10, wherein the second mask structure comprises a second photoresist layer and a third dielectric layer; and
- wherein performing a patterning process on the second mask structure to form the second pattern extending in the second direction comprises:
  - forming the second photoresist layer on the second sacrificial layer and the first dielectric layer;
  - performing an etching process on the second photoresist layer in the second direction to form a patterned second photoresist layer;
  - forming, on the second sacrificial layer, the third dielectric layer covering the second photoresist layer, third trenches arranged at intervals with the second photoresist layer being provided on a surface of the third dielectric layer;
  - removing the third dielectric layer located on a plane of top of the second photoresist layer and located below the third trenches; and
  - removing the second photoresist layer to form the second pattern extending in the second direction.

12. The method according to claim 11, wherein performing a patterning process on the MTJ structure by utilizing the second pattern to form the cellular MTJ array comprises:
- patterning the first dielectric layer, the second sacrificial layer and the MTJ structure by taking the third dielectric layer as a mask, and removing the second sacrificial layer and the third dielectric layer to form the cellular pattern with the remaining first dielectric layer and MTJ structure; and
- removing the first dielectric layer to obtain the cellular MTJ array.

13. The method according to claim 11, wherein a height ratio of the MTJ layer to the MTJ mask layer ranges from 0.5:1 to 1.5:1.

14. The method according to claim 1, wherein after the forming the cellular MTJ array, the method further comprises:
- forming, on the substrate, an insulating layer covering the cellular MTJ array.

15. The method according to claim 1, wherein an included angle between the first direction and the second direction is 60 degrees, and the cellular pattern is a hexagonal pattern.

16. A semiconductor structure manufactured by the method of claim 1, comprising:
- a substrate; and
- a cellular magnetic tunnel junction (MTJ) array formed on the substrate, wherein the cellular MTJ array is arranged in a cellular pattern, and the cellular pattern comprises a first pattern extending in a first direction and a second pattern extending in a second direction, and the first direction intersects the second direction, and is not perpendicular to the second direction;

wherein
- the second pattern extending in the second direction is formed by forming a second mask structure on the MTJ structure and performing a patterning process on the second mask structure; and
- the cellular MTJ array arranged in the cellular pattern is formed by performing a patterning process on the MTJ structure by utilizing the second pattern.

17. The semiconductor structure according to claim 16, further comprising
- an insulating layer, wherein the insulating layer is formed on the substrate, and covers the cellular MTJ array.

18. The semiconductor structure according to claim 16, wherein
- the cellular MTJ array comprises an MTJ layer and an MTJ mask layer, wherein the MTJ layer is formed on the substrate, and the MTJ mask layer is formed on the MTJ layer.

19. The semiconductor structure according to claim 16, wherein
- an included angle between the first direction and the second direction is 60 degrees, and the cellular pattern is a hexagonal pattern.

20. A semiconductor memory, comprising:
- the semiconductor structure according to claim 16.

* * * * *